(12) United States Patent
Miyaoka et al.

(10) Patent No.: US 9,282,657 B2
(45) Date of Patent: Mar. 8, 2016

(54) TERMINAL APPARATUS (71) Applicant: SONY MOBILE COMMUNICATIONS AB, Lund (SE)

(72) Inventors: Hidekazu Miyaoka, Kanagawa (JP); Nobuaki Hayashi, Tokyo (JP); Ken Imai, Tokyo (JP); Shingo Kawamura, Tokyo (JP); Takefumi Masuda, Mountain View, CA (US)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 124 days.

(21) Appl. No.: 13/707,099

(22) Filed: Dec. 6, 2012

(65) Prior Publication Data

US 2013/0162124 A1 Jun. 27, 2013

Related U.S. Application Data (60) Provisional application No. 61/580,544, filed on Dec. 27, 2011.

(51) Int. Cl.
*G06F 3/041* (2006.01)
*H05K 5/02* (2006.01)
*F21V 15/01* (2006.01)
*H05K 5/00* (2006.01)
*H04M 1/02* (2006.01)
*H04M 1/22* (2006.01)
*G06F 1/16* (2006.01)

(52) U.S. Cl.
CPC .............. *H05K 5/0217* (2013.01); *F21V 15/01* (2013.01); *G06F 1/1656* (2013.01); *G06F 3/0416* (2013.01); *H04M 1/0277* (2013.01); *H04M 1/0283* (2013.01); *H04M 1/22* (2013.01); *H05K 5/0004* (2013.01)

(58) Field of Classification Search
CPC ... G06F 3/0416; G06F 3/0428; G06F 1/1626; G06F 1/1656
USPC .......... 361/679.55, 679.56; 455/575.1–575.4, 455/575.8; 345/173
See application file for complete search history.

(56) References Cited

U.S. PATENT DOCUMENTS 3,041,436 A * 6/1962 Brady ........................... 219/203
6,963,039 B1 * 11/2005 Weng et al. ................ 200/302.1
7,095,617 B1 * 8/2006 Ni ................................. 361/736

(Continued)

FOREIGN PATENT DOCUMENTS

JP 2005-267897 A 9/2005

OTHER PUBLICATIONS

"Sony Ericsson Nozomi LT26i", MyPocketPC, Dec. 23, 2011, XP55060228, 2 pages, URL:http://www.mypocketpc.ch/2011/12/23/sony-ericsson-nozomi-lt26i.

(Continued)

*Primary Examiner* — Adrian S Wilson
(74) *Attorney, Agent, or Firm* — Oblon, McClelland, Maier & Neustadt, L.L.P.

(57) ABSTRACT

A terminal device is provided that includes a first case; a second case disposed in the terminal device with a gap with respect to the first case; and a transparent member that includes a transparent front-surface-side member bonded to a transparent rear-surface-side member and is disposed in the gap to connect the first case and the second case.

10 Claims, 8 Drawing Sheets

(56) References Cited

U.S. PATENT DOCUMENTS

| | | | |
|---|---|---|---|
| 7,098,897 B2* | 8/2006 | Vakil et al. | 345/173 |
| 7,283,697 B1* | 10/2007 | Morikuni et al. | 385/14 |
| 7,437,184 B2* | 10/2008 | Faust | 455/575.1 |
| 7,724,508 B2* | 5/2010 | Bemelmans et al. | 361/679.09 |
| 7,953,462 B2* | 5/2011 | Harry | 455/575.1 |
| 8,080,284 B2* | 12/2011 | Shi et al. | 427/259 |
| 8,116,827 B2* | 2/2012 | Tseng | 455/573 |
| 8,532,284 B2* | 9/2013 | Roemer | 379/428.02 |
| 8,570,225 B2* | 10/2013 | Shoji | H01Q 1/243 343/702 |
| 8,654,524 B2* | 2/2014 | Pance et al. | 361/679.55 |
| 8,665,236 B2* | 3/2014 | Myers | 345/173 |
| 2001/0012000 A1* | 8/2001 | Eberhard | 345/173 |
| 2002/0018169 A1 | 2/2002 | Kato | |
| 2004/0008478 A1* | 1/2004 | Chen | 361/683 |
| 2004/0233629 A1* | 11/2004 | Wang et al. | 361/684 |
| 2005/0277452 A1* | 12/2005 | Pasamba | 455/575.6 |
| 2009/0009944 A1* | 1/2009 | Yukawa et al. | 361/681 |
| 2009/0141436 A1* | 6/2009 | Matsuoka et al. | 361/679.09 |
| 2009/0295753 A1* | 12/2009 | King et al. | 345/174 |
| 2010/0026656 A1* | 2/2010 | Hotelling et al. | 345/174 |
| 2010/0127856 A1* | 5/2010 | Sipple | 340/540 |
| 2010/0165254 A1* | 7/2010 | Lee et al. | 349/65 |
| 2011/0021251 A1* | 1/2011 | Linden | 455/566 |
| 2011/0038114 A1* | 2/2011 | Pance et al. | 361/679.4 |
| 2011/0074608 A1* | 3/2011 | Kawamura | 341/22 |
| 2011/0151937 A1* | 6/2011 | Kusuda et al. | 455/566 |
| 2011/0165916 A1* | 7/2011 | Park et al. | 455/566 |
| 2012/0320507 A1* | 12/2012 | Kawaguchi | 361/679.01 |
| 2013/0044265 A1* | 2/2013 | Sasaki | 348/731 |
| 2013/0165189 A1* | 6/2013 | Shoji et al. | 455/575.1 |

OTHER PUBLICATIONS

"Black Sony Ericsson LT26i Nozomi Spotted in the Wild", Dec. 7, 2011, XP55060126, 9 pages URL:http://www.xperiablog.net/2011/12/7/black-sony-ericsson-lt26i-nozomi-spotted-in-the-wild.

"Sony Ericsson LT26i Nozomi High-res images leak", Dec. 12, 2011, XP55060124, 11 pages, URL:http://www.xperiablog.net/2011/12/12sony-ericsson-lt26i-nozomi-high-res-images-leak.

Jamie Pert, "Sony Ericsson Xperia Nozomi LT26i First Looks at Specs &Design", Nov. 7, 2011, XP055060127, 5 pages, URL:http://www.prodct-reviews.net/2011/11/07/sony-ericsson-xperia-nozomi-lt26i-first-looks-at-specs-design.

"Nozomi Xperia Lt26i Leaked", Dec. 7, 2011, XP55060123, 4 pages, URL:http://talk.sonymobile.com/thread/28162?start=0&tstart=0.

Extended Search Report issued May 3, 2013 in European Patent Application No. 12195831.8.

* cited by examiner

TERMINAL APPARATUS

CROSS REFERENCE TO RELATED APPLICATIONS

This application is related to and claims priority under 35 U.S.C. §119(e) to Provisional Application Ser. No. 61/580,544, filed Dec. 27, 2011, the contents of which are hereby incorporated herein by reference.

BACKGROUND

1. Field

This disclosure relates to terminal devices and transparent-member holding mechanisms, and more specifically, it relates to a technique applied to a terminal device in which a part of a case is formed of a transparent member.

2. Description of the Related Art

In conventional terminal devices, such as portable telephone terminal devices, keys that can be operated by users are arranged, and the keys are illuminated from the inside of the terminal devices. For example, some portable telephone terminal devices are configured such that light-emitting diodes are incorporated inside keys, and the light-emitting diodes are lit according to the operation conditions of the terminal devices, illuminating some keys.

Furthermore, in some cases, an illumination portion that serves as a pilot lamp is provided on a terminal device, independently of keys. For example, some terminal devices have a pilot lamp for indicating the power status, which turns on a green light when the power of the terminal device is on and turns on an orange light when the power of the terminal device is in a stand-by state.

In PTL 1, there is a description of a configuration in which a part of a case that constitutes a display device having a display panel is formed of a transparent member, and a specific part of the transparent member is illuminated with a light-emitting diode. By configuring in this manner, the part of the transparent member functions as an illumination portion serving as a pilot lamp.

CITATION LIST

Patent Literature

[PTL 1] Japanese Unexamined Patent Application Publication No. 2005-267897 Meanwhile, terminal devices, such as portable telephone terminal devices, are required to be compact and have multiple functions, and thus, the space for arranging keys and a pilot lamp in a case is limited. In particular, in the case of terminal devices called smart phones, which have a large display panel on the surface of the case and are widely used these days, the keys and the pilot lamp can be arranged only near the edge of the case constituting the terminal device, and their arrangement is limited from the standpoint of design.

The inventor recognizes the need for providing a terminal device that has increased flexibility in the arrangement of keys or an illumination portion in the terminal device and has an improved design.

BRIEF SUMMARY

A terminal device according to an embodiment of this disclosure is a terminal device including a first case, and a second case that is disposed with a gap with respect to the first case. The terminal device further includes a transparent member that includes a transparent front-surface-side member bonded to a transparent rear-surface-side member and is disposed in the gap to connect the first case and the second case.

Furthermore, in a transparent-member holding mechanism according to an embodiment of this disclosure, a transparent member formed by bonding a transparent front-surface-side member and a transparent rear-surface-side member connects a first case and a second case so as to leave a gap therebetween, and the first case and the second case hold the transparent member disposed between the two cases.

According to an embodiment of this disclosure, illumination for informing a user can be performed by using the transparent member disposed in the gap between the first case and the second case. Furthermore, by detecting a touch on the case at a position near the transparent member, the portion provided with the transparent member may be configured as keys that can be operated by a user.

DETAILED DESCRIPTION

Referring to the drawings, an example of a terminal device and a transparent-member holding mechanism according to an embodiment of this disclosure will be described below in the following order.

1. External Shape of Terminal Device (FIG. 1)
2. Configuration for Connecting First Case and Second Case (FIGS. 2 to 5)
3. Connecting Configuration Using Transparent Flexible Substrate (FIGS. 6 and 7)
4. Lit State of Transparent Portion (FIG. 8)
5. Modifications

[1. External Shape of Terminal Device]

Figure 1:
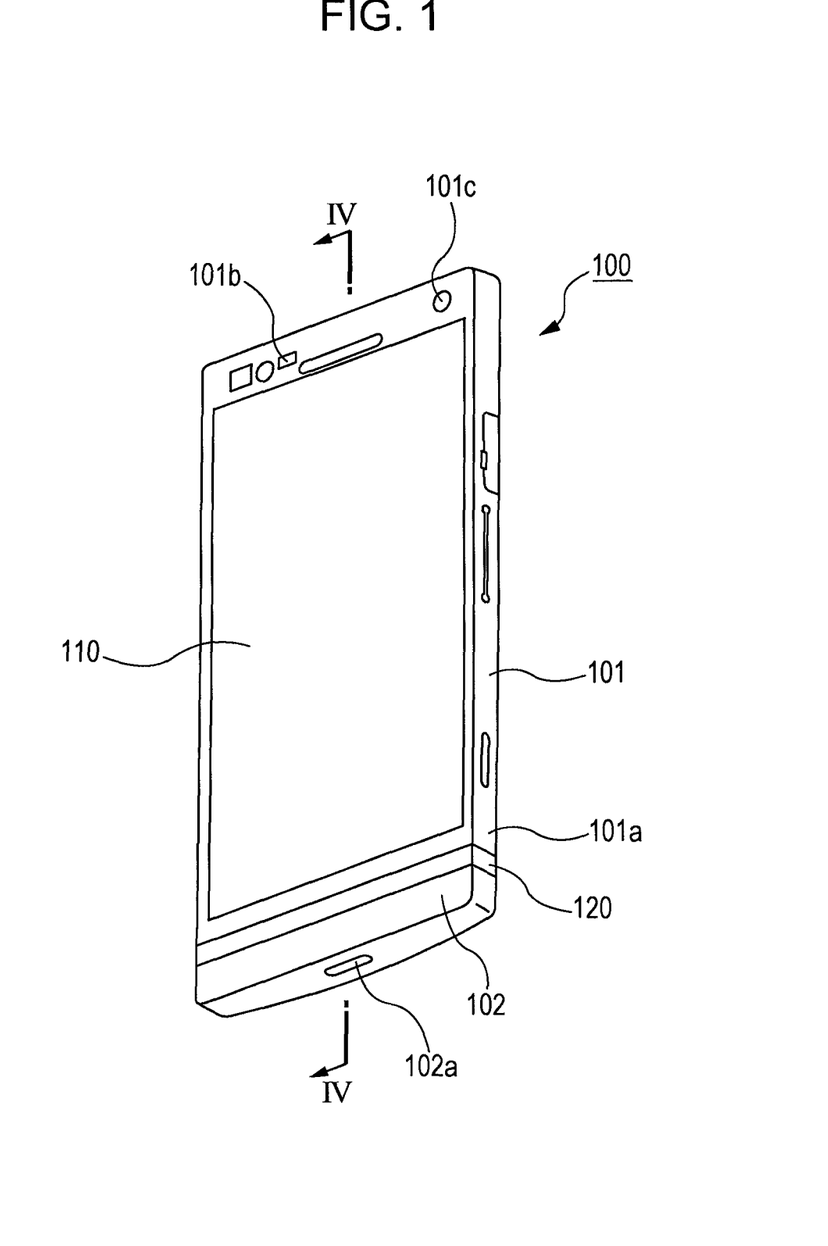
FIG. 1 is a perspective view showing an example of the shape of a terminal device according to an embodiment of this disclosure.

FIG. 1 shows the configuration of a terminal device according to an embodiment of this disclosure.

A terminal device 100 shown in FIG. 1 is a portable telephone terminal device called a "smart phone".

The terminal device 100 includes a first case 101 and a second case 102. The first case 101 has a display unit 110 on the surface thereof and accommodates therein an electric circuit constituting the portable telephone terminal device. The display unit 110 is a display panel, such as a liquid crystal display panel or an organic electroluminescence (EL) display panel. A touch panel is incorporated into the display panel provided for the display unit 110.

A transparent member 120 is connected to a lower part 101a of the first case 101, and the second case 102 is connected to a lower part of the transparent member 120. The transparent member 120 is disposed over the entire width of the first case 101 and the second case 102. Thus, in the terminal device 100, the first case 101 and the second case 102 are arranged at a certain gap therebetween. The second case 102 is a small member that accommodates an antenna, a microphone, and a vibrator.

The lower end of the second case 102 is provided with a microphone attaching portion 102*a*.

The upper end of the first case 101 is provided with a speaker attaching portion 101*b* and a camera attaching portion 101*c*, and a speaker and a camera unit are disposed inside the first case 101, at the attaching portions 101*b* and 101*c*, respectively.

Note that the touch panel of the display unit 110 performs touch detection in a slightly larger area than a display area of the display panel, near the lower part 101*a* of the first case 101. For example, if a user touches a portion slightly lower than an image display area of the display panel, adjoining the transparent member 120, this user's operation is detected by the touch panel. [2. Configuration for Connecting First Case and Second Case]

Next, referring to FIGS. 2 to 5, the configuration for connecting the first case 101 and the second case 102 with the transparent member 120 will be described.

Figure 2:
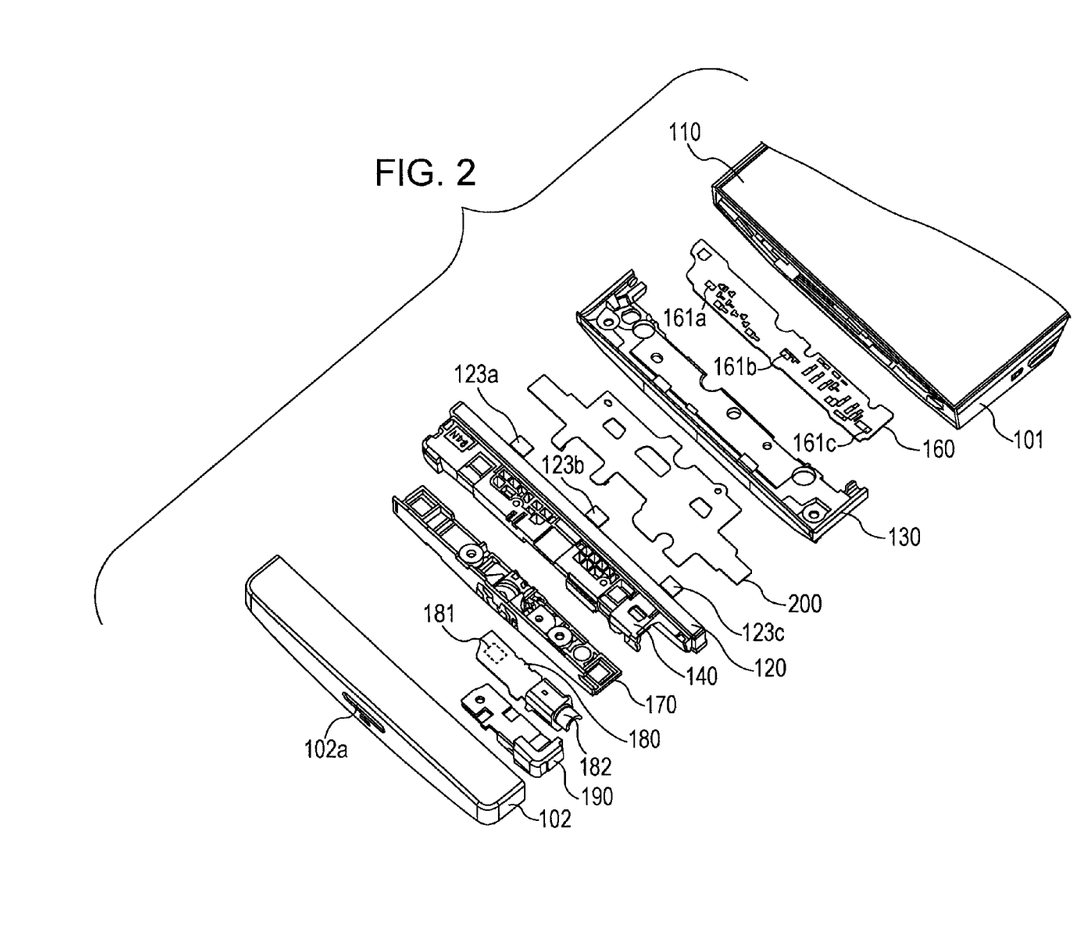
FIG. 2 is an exploded perspective view of a part of the terminal device of the example in FIG. 1.

FIG. 2 is a view showing components arranged near the transparent member 120, inside the first case 101 and the second case 102, in an exploded manner.

As shown in FIG. 2, a support member 130 is attached to the upper side of the transparent member 120, and a support member 140 is attached to the lower side of the transparent member 120. The support member 130 and the support member 140 are members formed of an opaque (e.g., white) resin. Although FIG. 2 shows the support member 130 and the transparent member 120 in a separate manner, the transparent member 120 and the support members 130 and 140 are formed integrally.

The upper support member 130 is stored in the first case 101, and the lower support member 140 is stored in the second case 102. Note that the transparent member 120 and the support members 130 and 140 shown in FIG. 2 are members each obtained by bonding a front-side member and a back-side member.

The transparent member 120 sandwiches a transparent flexible substrate 200 provided with a transparent electrode and the like. Details of the configuration for sandwiching the transparent flexible substrate 200 will be described below.

A circuit substrate 160 is attached to the support member 130 above the transparent member 120. An antenna member 170 and a circuit substrate 180 are attached to the support member 140 below the transparent member 120. A microphone 181 and a vibrator 182 are attached to the circuit substrate 180.

The circuit substrate 160 disposed above the transparent member 120 is electrically connected to the antenna 170 and the circuit substrate 180 disposed below the transparent member 120 via a wiring pattern on the transparent flexible substrate 200. Details of this electrically connected state will be described below.

The transparent member 120 has three transparent extending portions 123*a*, 123*b*, and 123*c* protruding upward. The circuit substrate 160 to be attached to the support member 130 has three light-emitting diodes 161*a*, 161*b*, and 161*c*, which are located adjacent to the transparent extending portions 123*a*, 123*b*, and 123*c* in an assembled state.

Figure 3:
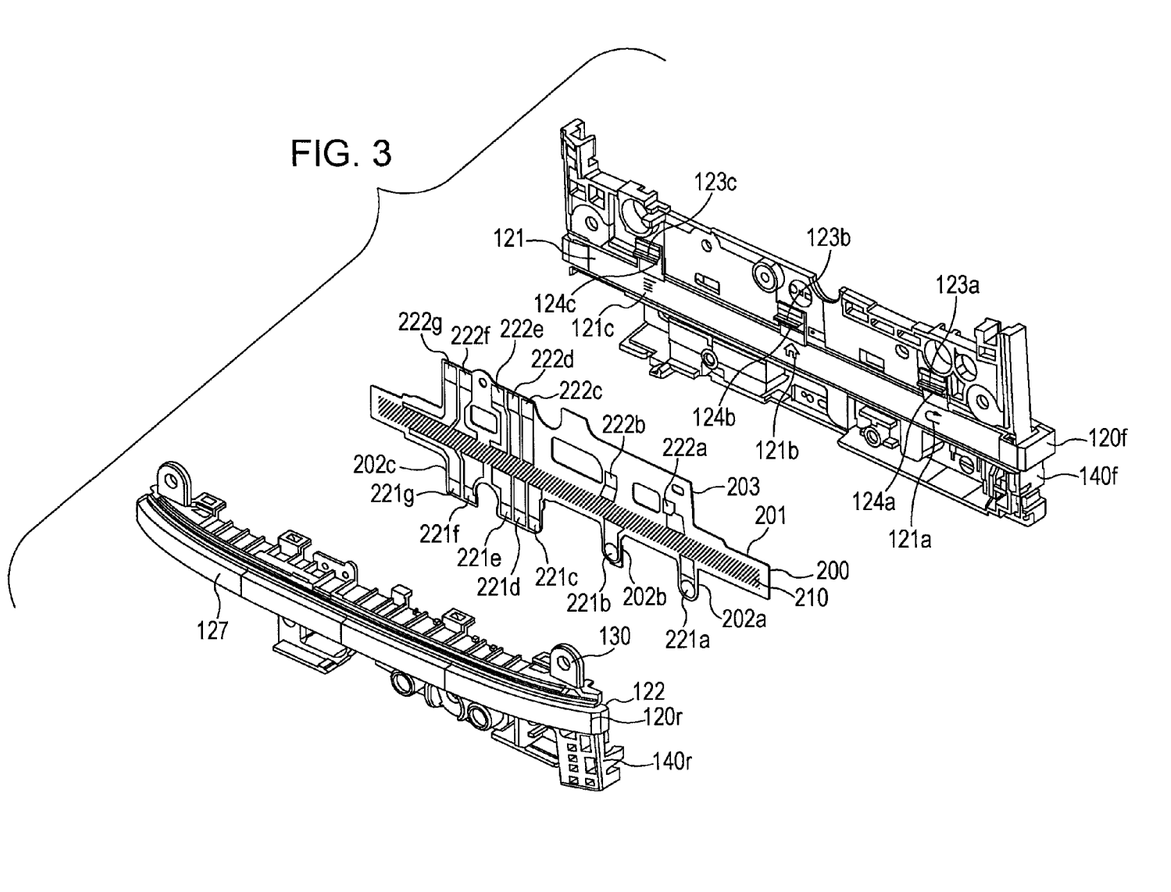
FIG. 3 is an exploded perspective view of a component constituting the terminal device of the example in FIG. 1.

FIG. 3 shows details of the configuration in which the transparent member 120 sandwiches the transparent flexible substrate 200. As shown in FIG. 3, the transparent member 120 is formed by bonding a front transparent member 120*f* and a rear transparent member 120*r*. In FIG. 3, the near side is the rear surface of the terminal device 100, and the far side is the front surface thereof. A back surface 127 of the rear transparent member 120*r* (the near-side surface in FIG. 3) is curved so as to conform to the shape of the back surfaces of the first case 101 and the second case 102.

The front transparent member 120*f* and the rear transparent member 120*r* are made of, for example, a transparent acrylic resin.

A front-side support member 130*f* is formed integrally with the upper part of the front transparent member 120*f*, and a front-side support member 140*f* is formed integrally with the lower part of the front transparent member 120*f*. A back-side support member 130*r* is formed integrally with the upper part of the rear transparent member 120*r*, and a back-side support member 140*r* is formed integrally with the lower part of the rear transparent member 120*r*. The front-side support members 130*f* and 140*f* and the back-side support members 130*r* and 140*r*, which are formed integrally above and below the front transparent member 120*f* and the rear transparent member 120*r*, are formed of a colored (e.g., white) resin. In the following description, the front-side support members 130*f* and 140*f* and the back-side support members 130*r* and 140*r* are described as white components.

The transparent members 120*f* and 120*r* and the support members 130*f*, 130*r*, 140*f*, and 140*r*, which are white, are integrally formed by, for example, coinjection molding (double mode). More specifically, when resin is molded, first, a white resin is charged into molds to form the support members 130*f*, 130*r*, 140*f*, and 140*r*. Then, with the members made of the white resin remaining in the molds, a transparent resin is charged into the molds to form the clear transparent members 120*f* and 120*r*. Forming the transparent members first is an example, and it may be configured such that the white support members are formed first.

The three transparent extending portions 123*a*, 123*b*, and 123*c*, described in FIG. 2, are integrally formed of a transparent resin near and above a bonding surface 121 of the front transparent member 120*f*. The transparent extending portions 123*a*, 123*b*, and 123*c* have transparent projections 124*a*, 124*b*, and 124*c*, respectively, in the middle thereof. Although the transparent extending portions 123*a*, 123*b*, and 123*c* are thin and fragile by themselves, because they are formed integrally with the front-side support member 130*f*, the front-side support member 130*f* supports the transparent extending portions 123*a*, 123*b*, and 123*c*, and the rigidity thereof is maintained.

As shown in FIG. 3, three printed patterns 121*a*, 121*b*, and 121*c* are provided on the bonding surface 121 of the front transparent member 120*f*. The printed patterns 121*a*, 121*b*, and 121*c* are patterns showing operation keys formed at the portions where the printed patterns 121*a*, 121*b*, and 121*c* are printed in simple illustrations. For example, the printed pattern 121*a* is a diagram of a back key, the printed pattern 121*b* is a diagram of a home key, and the printed pattern 121*c* is a diagram of a menu key. These printed patterns 121*a* to 121*c* are printed in a color that is close to transparent, so that the printed patterns 121*a* to 121*c* become visible when illuminated, as described below.

When the bonding surface 121 of the transparent member 120*f* and the bonding surface 122 of the transparent member 120*r* are bonded, the transparent flexible substrate 200 is sandwiched therebetween and a transparent adhesive 401 (FIG. 5) is used. Bonding with the adhesive 401 is an example, and an adhesive tape may be used to bond them. Alternatively, the adhesive 410 and an adhesive tape may be used together.

The transparent flexible substrate 200 is made of a resin material having high transparency, such as polyethylene terephthalate (PET). The transparent flexible substrate 200 includes a strip portion 201 sandwiched between the front transparent member 120f and the rear transparent member 120r, and lower projections 202a, 202b, and 202c protruding downward from the strip portion 201, and an upper projection 203 protruding upward from the strip portion 201.

The strip portion 201 is provided with a transparent electrode pattern portion 210. The projections 202a, 202b, 202c, and 203 are provided with pad portions 221a to 221g and 222a to 222g, which are connected to the transparent electrode pattern portion 210. Details of the configuration of the electrode pattern provided on the transparent flexible substrate 200 will be described below.

Figure 4:
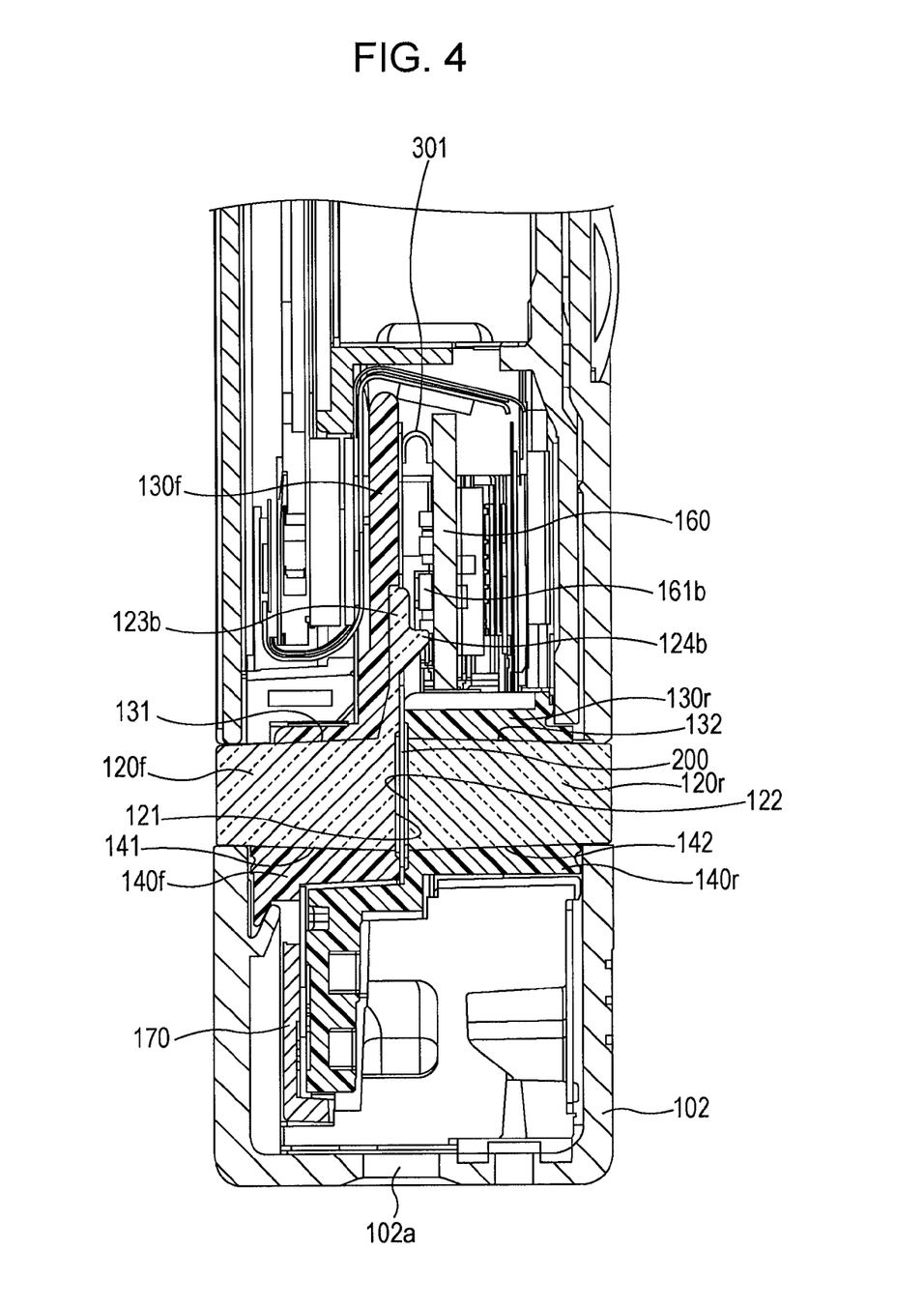
FIG. 4 is a partial sectional view taken along line IV-IV in FIG. 1.

FIG. 4 is a cross section showing a state in which components are arranged in the terminal device 100. FIG. 4 is a cross section longitudinally taken at substantially the center of the terminal device 100, as indicated by line IV-IV in FIG. 1.

As shown in FIG. 4, the transparent flexible substrate 200 is sandwiched between the front transparent member 120f and the rear transparent member 120r. The transparent extending portion 123b of the front transparent member 120f extends upward along the support member 130f, and the transparent projection 124b in the middle of the transparent extending portion 123b is arranged close to the light-emitting diode 161b attached to the circuit substrate 160. Thus, by the light-emitting diode 161b emitting light, light is incident on the transparent extending portion 123b, and the light guided by the transparent extending portion 123b illuminates the area near the bonding surface 121 of the front transparent member 120f. Here, as shown in FIG. 3, the bonding surface 121 is provided with the printed pattern 121b (see FIG. 3), and the printed pattern 121b becomes visible when illuminated with the light-emitting diode 161b. The other printed patterns 121a and 121c also become visible when the corresponding light-emitting diodes 161a and 161c emit light.

Note that, as can be seen from the cross-sectional view in FIG. 4, the front transparent member 120f is configured such that the upper end thereof is in contact with an edge 131 of the white front-side support member 130f and the lower end thereof is in contact with an edge 141 of the white front-side support member 140f. Furthermore, the rear transparent member 120r is configured such that the upper end thereof is in contact with an edge 132 of the white back-side support member 130r and the lower end thereof is in contact with an edge 142 of the white back-side support member 140r. By doing so, when the light-emitting diodes 161a to 161c are caused to emit light, the light reaches the front surface and the rear surface without leaking upward or downward from the transparent members 120f and 120r, and thus, the transparent members 120f and 120r are efficiently illuminated with the emitted light.

Figure 5:
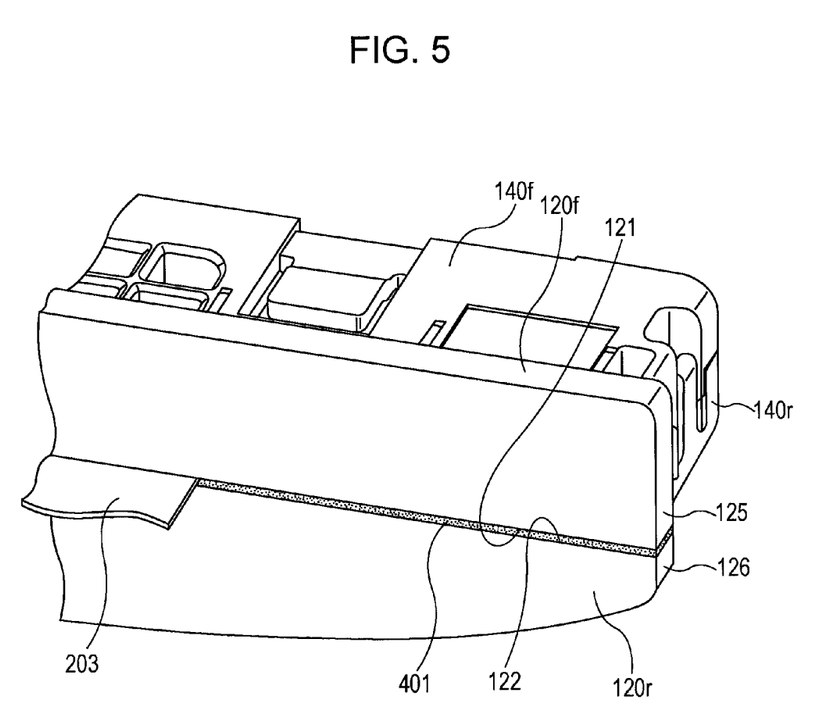
FIG. 5 is a perspective view of a component constituting the terminal device of the example in FIG. 1.

FIG. 5 is a diagram showing a state in which the front transparent member 120f and the rear transparent member 120r are bonded. FIG. 5 shows a state in which the front-side support member 130f and the back-side support member 130r are excluded. The bonding surface 121 of the front transparent member 120f and the bonding surface 122 of the rear transparent member 120r are bonded by charging a transparent adhesive 401 therebetween. Then, the transparent flexible substrate 200 is disposed between the bonding surfaces 121 and 122. FIG. 5 shows a state in which the strip portion 201 of the transparent flexible substrate 200 is sandwiched between the bonding surfaces 121 and 122 and is hidden, and the upper projection 203 extends upward from the bonding surfaces 121 and 122.

Note that, when the front transparent member 120f and the rear transparent member 120r are bonded, an end surface 125 of the front transparent member 120f and an end surface 126 of the rear transparent member 120r are polished. The purpose of this is to remove resin charging gates, which are provided on the end surfaces 125 and 126 when forming the transparent members 120f and 120r from resin, by polishing to make the end surfaces 125 and 126 flush with each other.

[3. Connecting Configuration Using Transparent Flexible Substrate]

Next, referring to FIGS. 6 and 7, a configuration for connecting a circuit in the first case 101 and a circuit in the second case 102 using the transparent flexible substrate 200 will be described.

Figure 6:
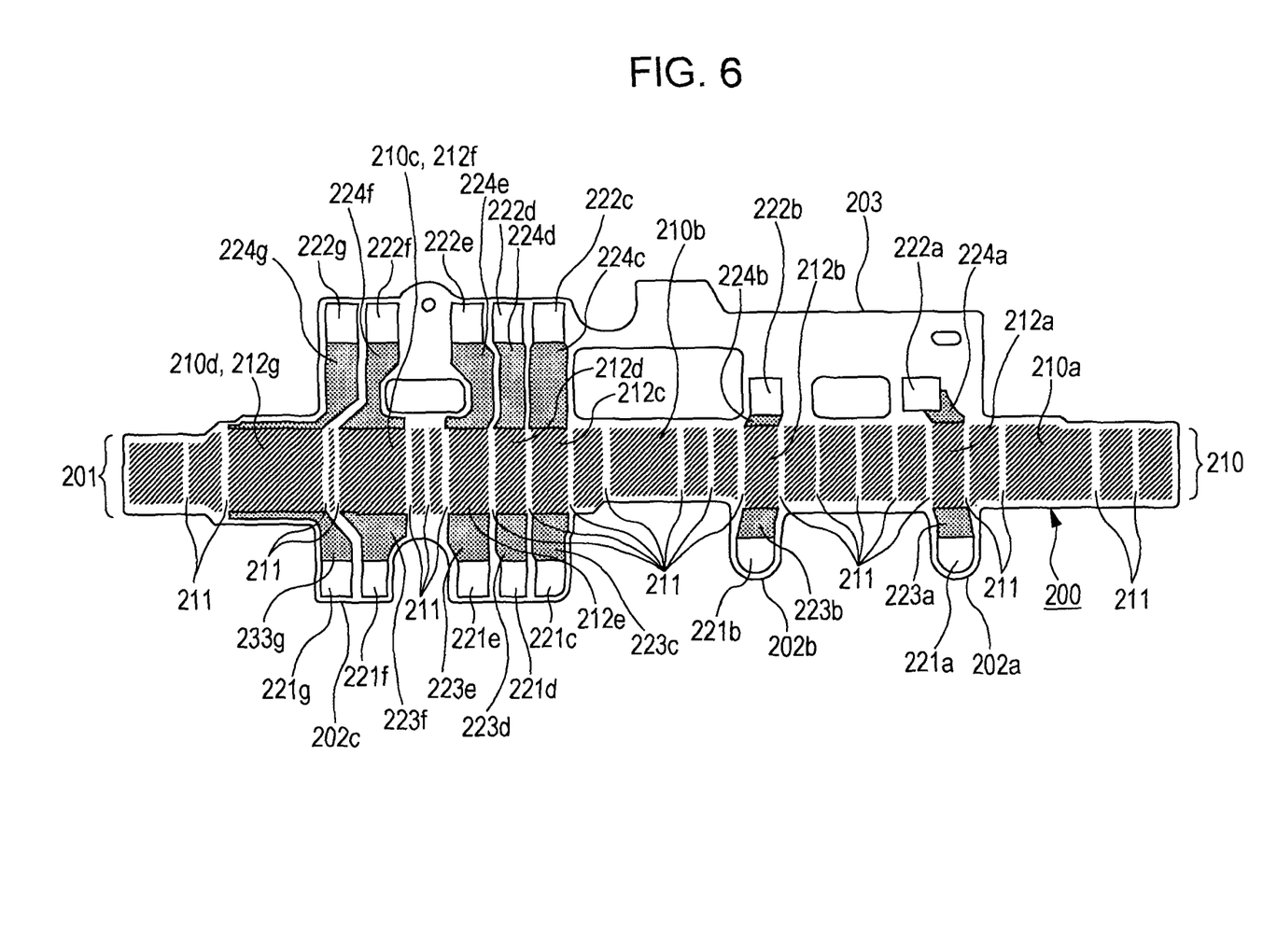
FIG. 6 is a plan view showing a transparent substrate disposed in the terminal device of the example in FIG. 1.

FIG. 6 shows an arrangement example of electrodes on the transparent flexible substrate 200. The transparent flexible substrate 200, which is formed of a transparent resin material, such as PET, is formed by arranging the transparent electrode pattern portion 210, which is a transmission area, on the above-described strip portion 201 sandwiched between the front transparent member 120f and the rear transparent member 120r. The transparent electrode pattern portion 210 is an electrode pattern in which very narrow electrodes are arranged in a grid pattern so that a large part of it serves as a transmission portion and looks substantially transparent. The electrodes are arranged at a constant pitch in the grid pattern. Therefore, the grid-like transparent electrode pattern portion 210 is not completely transparent, and it is slightly visible when illuminated relatively brightly.

The grid-like transparent electrode pattern portion 210 is divided into a plurality of electrodes by a plurality of pattern-dividing portions 211 extending in the vertical direction (longitudinal direction of the terminal device 100), and some of the plurality of electrodes are used as wires 212a to 212g. Note that the pattern-dividing portions 211 are provided also at portions not used as the wires 212a to 212g.

Furthermore, the pattern-dividing portions 211 divide the transparent electrode pattern portion 210 so as to provide four wide portions 210a, 210b, 210c, and 210d. Three wide portions 210a, 210b, and 210d of these four wide portions 210a to 210d are attached to the portions of the bonding surface 121 of the front transparent member 120f where the printed patterns 121a, 121b, and 121c (FIG. 3) are printed.

The wires 212a to 212g of the transparent electrode pattern portion 210 are electrically connected to opaque electrode portions 223a to 223g and 224a to 224g. The opaque electrode portions 223a to 223g and 224a to 224g are electrode portions in which a typical conducting material, such as copper, is disposed on the transparent flexible substrate 200. The opaque electrode portions 223a to 223g and 224a to 224g are provided with the pad portions 221a to 221g and 222a to 222g, where conducting portions are exposed. The pad portions 221a to 221g and 222a to 222g are provided with, for example, gold plating.

The connecting states of the wires are described in more detail. For example, the wire 212a is connected to the opaque electrode portion 223a below the transparent flexible substrate 200 and is connected to the opaque electrode portion 224a above the transparent flexible substrate 200. The lower opaque electrode portion 223a has the pad portion 221a, and the upper opaque electrode portion 224a has the pad portion 222a.

The wire 212b is connected to the opaque electrode portion 223b below the transparent flexible substrate 200 and is connected to the opaque electrode portion 224b above the transparent flexible substrate 200. The lower opaque electrode portion 223b has the pad portion 221b, and the upper opaque electrode portion 224b has the pad portion 222b.

The two wires 212a and 212b are used as wires for an antenna accommodated in the antenna member 170, and the antenna member 170 in the second case 102 and a wireless communication circuit (not shown) in the first case 101 are connected by the transparent wires 212a and 212b.

Furthermore, the three wires 212c, 212d, and 212e, arranged side-by-side, are connected to the opaque electrode portions 223c, 223d, and 223e below the transparent flexible substrate 200 and are connected to the opaque electrode portions 224c, 224d, and 224e above the transparent flexible substrate 200. The lower opaque electrode portions 223c, 223d, and 223e have the pad portions 221c, 221d, and 221e, and the upper opaque electrode portions 224c have the pad portions 222c, 222d, and 222e, respectively.

The three wires 212c, 212d, and 212e are used as wires for the microphone 181, and an audio signal obtained in the microphone 181 in the second case 102 is supplied to an audio processing circuit (not shown) in the first case 101.

Furthermore, the wires 212f and 212g are connected to the opaque electrode portions 223f and 223g below the transparent flexible substrate 200 and are connected to the opaque electrode portions 224f and 224g above the transparent flexible substrate 200. The lower opaque electrode portions 223f and 223g have the pad portions 221f and 221g, respectively, and the upper opaque electrode portion 224c has the pad portions 222f and 222g.

These two wires 212f and 212g are used as wires for supplying driving signals to the vibrator 182. Note that the wires 212f and 212g use the wide portions 210c and 210d of the transparent electrode pattern portion 210. The vibrator 182 is a member that vibrates the terminal device 100 by causing a vibrating element to vibrate by means of rotation of a motor. Thus, a relatively large electric current flow is needed to drive the vibrator 182. With the transparent wires 212f and 212g using the wide portions 210c and 210d, the necessary electric current can be supplied to the vibrator 182.

Figure 7:
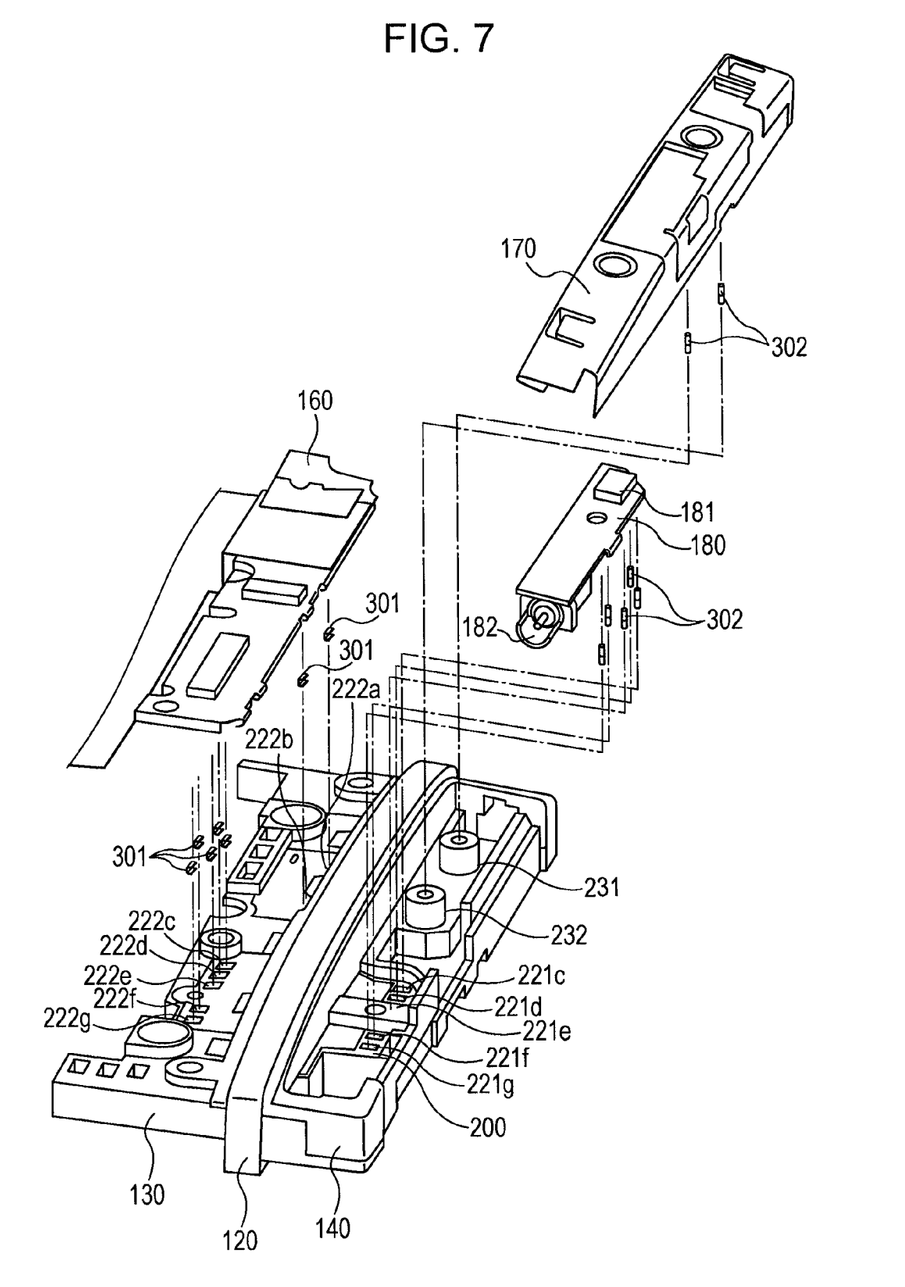
FIG. 7 is an exploded perspective view of a component constituting the terminal device of the example in FIG. 1.

FIG. 7 is a diagram showing, in an exploded manner, circuit substrates and components connected to the pad portions 221a to 221g and 222a to 222g of the transparent flexible substrate 200 sandwiched in the transparent member 120. As shown in FIG. 7, the support member 130 is formed integrally with the upper part (left part in FIG. 7) of the transparent member 120, and the support member 140 is formed integrally with the lower part (right part in FIG. 7) of the transparent member 120. As has been described, in the assembled state, the support member 130 is accommodated in the first case 101 shown in FIG. 1, the support member 140 is accommodated in the second case 102 shown in FIG. 1, and the transparent member 120 connects the two cases 101 and 102.

The transparent flexible substrate 200 shown in FIG. 6 is sandwiched between the front transparent member 120f and the rear transparent member 120r constituting the transparent member 120, and the pad portions 221a to 221g and 222a to 222g are exposed from the support members 130 and 140. Note that, in FIG. 7, the pad portions 221a and 221b are hidden by pin holding portions 231 and 232 provided on the support member 140.

The pad portions 221a and 221b in the pin holding portions 231 and 232 of the support member 140 are connected to a circuit connecting portion of the antenna member 170 through pins 302. Furthermore, the pad portions 221c, 221d, and 221e are connected to the microphone 181 on the circuit substrate 180 through the pins 302. Furthermore, the pad portions 221f and 221g are connected to the vibrator 182 on the circuit substrate 180 through the pins 302.

The pins 302 are conducting members that have springs therein and connect the pad portions 221a to 221g and the components in an electrically stable manner.

Furthermore, the pad portions 222a to 222g arranged on the support member 130 side are connected to conducting portions (not shown) of the circuit substrate 160 through plate springs 301. The provision of the plate springs 301 makes the electrical connection between the pad portions 222a to 222g and the circuit substrate 160 stable.

As shown in FIG. 7, the circuit substrate 160, which is disposed in the first case 101, and the antenna member 170, the microphone 181, and the vibrator 182, which are disposed in the second case 102, are electrically connected by using the transparent wires 212a to 212g arranged on the transparent flexible substrate 200, shown in FIG. 6, in this manner.

Thus, the circuit in the first case 101 and the electronic components in the second case 102, which are connected via the transparent member 120 as shown in FIG. 1, are electrically connected. More specifically, the terminal device 100 performs wireless signal transmission using the antenna member 170 in the second case 102, and the antenna is disposed at a desired position at the lower end. Furthermore, the terminal device 100 also has the microphone 181 in the second case 102 at the lower end, and the microphone 181 can be disposed at a desired position at the lower end. Furthermore, the vibrator 182 can also be provided at the lower end of the terminal device 100, which is a suitable position for vibrating the terminal device 100.

Furthermore, although the transparent electrode pattern allows less electric current to flow therethrough than a typical copper conducting portion, the transparent wires 212f and 212g, shown in FIG. 6, which supply the vibrator 182 with driving signals having a relatively large electric current, can allow a relatively large electric current to flow therethrough by using the wide portions 210c and 210d.

Furthermore, as shown in FIG. 6, by providing the transparent wires 212a and 212b for connecting the antenna member 170 at positions relatively far from the other wires 212c to 212g, and by providing multiple pattern-dividing portions 211, excellent antenna characteristics can be ensured. That is, by dividing the transparent electrode pattern portion 210 by the multiple pattern-dividing portions 211 at certain intervals, the transparent electrode pattern portion 210 does not have a relatively large capacitance. Thus, no unnecessary capacitor is disposed near the antenna, and hence, the antenna characteristics are not degraded.

[4. Lit State of Transparent Portion]

Figure 8:
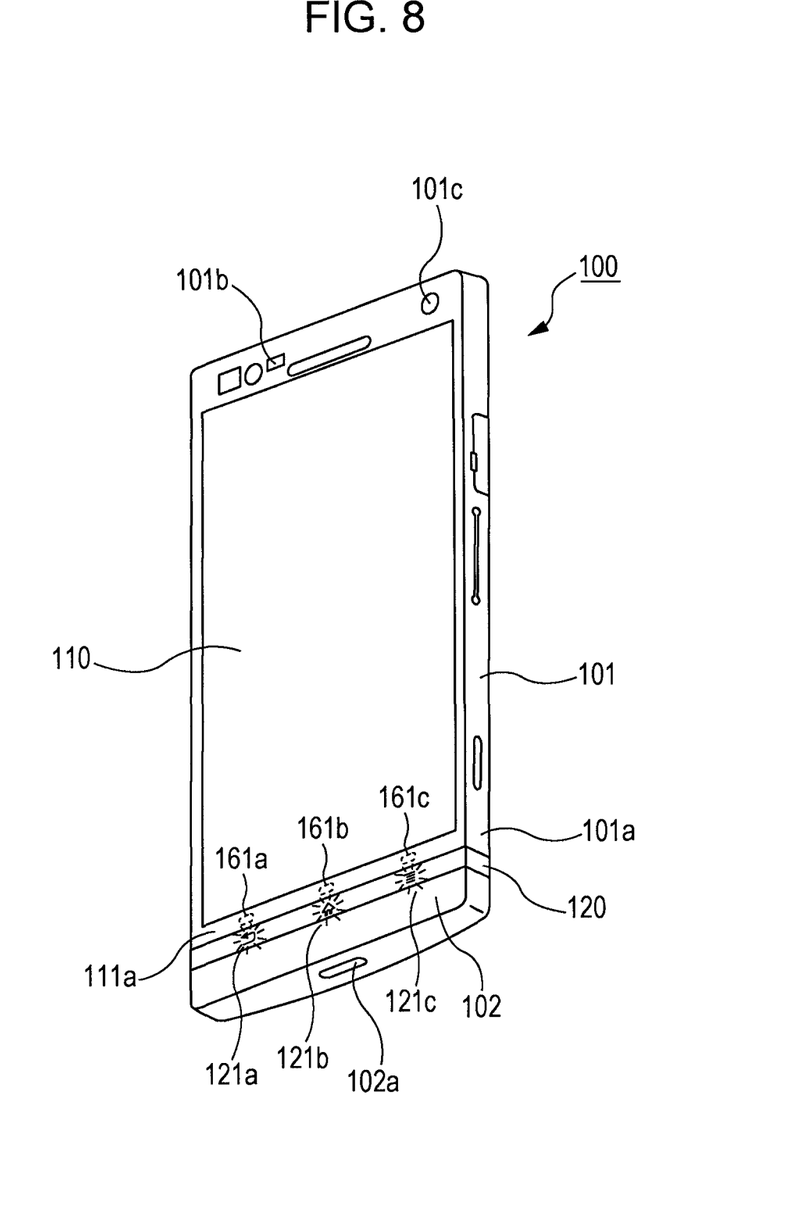
FIG. 8 is a perspective view showing a state in which some parts of the terminal device of the example in FIG. 1 are lit.

Next, a state in which the light-emitting diodes 161a, 161b, and 161c disposed near the transparent member 120 of the terminal device 100 are lit will be described with reference to FIG. 8.

The display unit 110 is configured to cover substantially the entire surface of the first case 101, and the touch panel of the display unit 110 has sensitivity capable of detecting a touch at the lower part 101a of the first case. As shown in FIG. 8, the three light-emitting diodes 161a, 161b, and 161c are disposed at the lower part 101a of the first case 101. Here, let us assume that a user having the terminal device 100 touches the surface of the case 101, at a position near the portion where the light-emitting diode 161a, 161b, or 161c is disposed.

At this time, the touch panel of the display unit 110 detects the touching operation and performs an action according to the touching operation. As a result of this operation, the light-emitting diode 161a, 161b, or 161c located near the position where the touching operation is detected emits light. When the light-emitting diode 161a, 161b, or 161c is lit, the bonding surface 121 of the transparent member 120 is illuminated, and the printed pattern 121a, 121b, or 121c (FIG. 3) provided at the position corresponding to the illuminated portion becomes visible.

The three light-emitting diodes 161a, 161b, and 161c may be caused to emit light either independently when a touch at each position is detected, or simultaneously when a touch at any position is detected. Alternatively, light may be emitted according to the operation mode of the terminal device 100, regardless of the touch detection.

As has been described, in the terminal device 100, the portion provided with the transparent member 120 functions as touch keys with illumination. Furthermore, by indicating the functions allocated for the keys with the printed patterns 121a, 121b, and 121c and by providing the transparent member 120, a terminal device that is improved in design and ease of operation is achieved.

Note that the portions where the printed patterns 121a, 121b, and 121c are provided are the wide portions 210a, 210b, and 210d of the transparent electrode pattern portion 210 of the transparent flexible substrate 200 shown in FIG. 6. Thus, because the portions where the printed patterns 121a, 121b, and 121c are illuminated are the portions where the pattern-dividing portions 211 are not disposed, unwanted line portions are not viewed by illuminating the portions provided with the pattern-dividing portions 211.

Furthermore, as can be seen from the cross section in FIG. 4, the transparent member 120 is configured such that the upper end thereof is in contact with the edges 131 and 132 of the white support member 130 and the lower end thereof is in contact with the edges 141 and 142 of the white support member 140. Thus, the light guided from the light-emitting diodes 161a, 161b, or 161c into the transparent member 120 efficiently reaches the front surface and the rear surface without leaking upward or downward, and good illumination is achieved.

[5. Modifications]

The above-described embodiment has shown an example of a terminal device applied to a portable telephone terminal device called a "smart phone". However, the same configuration may be applied to various other terminal devices. For example, the transparent-member holding mechanism of this disclosure may be applied to a portable audio playback device by forming the portable audio playback device of a first case and a second case and connecting the first case and the second case by a transparent member.

Furthermore, although the above-described embodiment is configured such that the transparent flexible substrate 200 is sandwiched in the transparent member 120, in the case of, for example, a configuration in which no electronic component is provided in the second case 102, a configuration in which the transparent flexible substrate 200 is omitted is possible.

Furthermore, the above-described embodiment has shown an example in which the antenna, the microphone, and the vibrator are disposed in the second case 102, and they are connected to the circuit in the first case 101 through the transparent electrode. However, other electronic components may be disposed in the second case 102, and such electronic components may be connected to the circuit in the first case 101 through the transparent electrode pattern in the transparent flexible substrate 200.

Furthermore, in the above-described embodiment, the touch panel on the first case 101 is used as a touch detection sensor to make the area near the transparent member 120 function as touch keys. However, it may be configured such that, for example, a touch detection sensor is disposed in the second case 102 to detect a touch on the surface of the second case 102, and the transparent member 120 is illuminated. In this case, the touch detection sensor in the second case 102 is connected to the circuit in the first case 101 through the transparent electrode pattern in the transparent flexible substrate 200.

Furthermore, although the transparent electrode pattern 210 is made of a narrow-width conducting material, such as copper, arranged in a grid pattern so that it looks substantially transparent, it may be configured as a transparent electrode pattern formed of a transparent electrode material, such as indium-tin-oxide (ITO).

Furthermore, in the above-described embodiment, the members 130 and 140 disposed above and below the transparent member 120 are white. By making the members 130 and 140 white, the light illuminating inside the transparent member 120 is efficiency guided. However, other colors may be used. For example, a color that reflects light, such as silver, may be used. Furthermore, although the members 130 and 140 disposed above and below the transparent member 120 are formed integrally with the transparent member 120 by coinjection molding in the above-described embodiment, they may be molded as separate components and subsequently bonded by adhesion or the like.

Furthermore, the configurations and processing described in Claims of this disclosure are not limited to the above-described examples of the embodiment. It should be understood that it is obvious for those skilled in the art that various modifications, combinations, and other embodiments may occur due to design or other factors, as long as within the scope of the Claims or the scope equivalent to the Claims.

REFERENCE SIGNS LIST

100: terminal device, 101: first case, 101a: lower part of first case, 101b: speaker attaching portion, 101c: camera attaching portion, 102: second case, 102a: microphone attaching portion, 110: display unit, 120: transparent member, 120f: front transparent member, 120r: rear transparent member, 121: bonding surface, 121a, 121b, 121c: printed pattern, 122: bonding surface, 123a, 123b, 123c: transparent extending portions, 124a, 124b, 124c: transparent projection, 125, 126: end surface, 127: back surface, 130: support member, 130f: front-side support member, 130r: back-side support member, 140: support member, 140f: front-side support member, 140r: back-side support member, 160: circuit substrate, 161a, 161b, 161c: light-emitting diode, 170: antenna member, 180: circuit substrate, 181: microphone, 182: vibrator, 190: spacer, 200: transparent flexible substrate, 201: strip portion, 202a, 202b, 202c: lower projection, 203: upper projection, 210: transparent electrode pattern portion, 210a, 210b, 210c, 210d: wide portion, 211: pattern-dividing portion, 212a to 212g: wire, 221a to 221g and 222a to 222g: pad portion, 223a to 223g and 224a to 224g: opaque electrode portion, 231, 233: pin holding portion, 301: plate spring, 302: pin, 401: adhesive.

What is claimed is:

1. A terminal device comprising:
a first case;
a second case disposed in the terminal device with a gap with respect to the first case;
a transparent member that includes a transparent front-surface-side member bonded to a transparent rear-surface-side member and is disposed in the gap to connect the first case and the second case, wherein an outer surface of the transparent member is flush with an outer surface of the first case and the second case;

a light-emitting element disposed inside the first case or the second case, at a position proximal to the transparent member but not within the transparent member, and the transparent member receives light emitted by the light-emitting element; and a touch panel that is disposed on a surface of the first case and separate from the transparent member and that detects contact from an external object, wherein the light-emitting element emits light in accordance with the touch panel detecting contact on a portion of the terminal device proximal to the transparent member.

2. The terminal device according to claim 1, wherein a pattern is printed on a bonding surface of the front-surface-side member, the printed pattern being visible inside the transparent member when illuminated by the light emitting element.

3. The terminal device according to claim 2, wherein the printed pattern represents an operation key selected by a user when the touch panel detecting contact on the portion of the terminal device proximal to the transparent member.

4. The terminal device according to claim 3, wherein the operation key is one of a back key, a home key, and a menu key.

5. The terminal device according to claim 1, wherein a transparent substrate having a substantially transparent electrode is sandwiched between the front-surface-side member and the rear-surface-side member, wherein the substantially transparent electrode electrically connects the inside of the first case and the inside of the second case.

6. The terminal device according to claim 5, wherein the transparent substrate includes an electrode pattern including a plurality of electrodes separated from each other by pattern dividing portions.

7. The terminal device according to claim 6, wherein the second case houses a vibrator and at least one other device, and the electrodes configured to provide current to the vibrator are wider than the electrodes configured to provide current to the other device.

8. The terminal device according to claim 1, wherein the first case houses at least one of a speaker and a camera, and the second case houses at least one of an antenna, a microphone, and a vibrator.

9. The terminal device according to claim 1, wherein the transparent member is disposed over an entire width of the first case and the second case.

10. A transparent-member holding mechanism comprising:

a first case; and a second case disposed with a gap with respect to the first case;

wherein the first case and second case hold a transparent member that includes a transparent front-surface-side member bonded to a transparent rear-surface-side member and the transparent member being disposed in the gap to connect the first case and the second case, wherein an outer surface of the transparent member is flush with an outer surface of the first case and the second case, and a light-emitting element is disposed inside the first case or the second case, at a position proximal to the transparent member but not within the transparent member, and the transparent member receives light emitted by the light-emitting element, wherein a surface of the first case is configured to receive a touch panel that is separate from the transparent member and that detects contact from an external object, wherein the light-emitting element emits light in accordance with the touch panel detecting contact on a portion of the transparent member holding mechanism proximal to the transparent member.

* * * * *